United States Patent [19]

Shikata et al.

[11] Patent Number: 4,859,618

[45] Date of Patent: Aug. 22, 1989

[54] METHOD OF PRODUCING THE GATE ELECTRODE OF A FIELD EFFECT TRANSISTOR

[75] Inventors: Shinichi Shikata; Hideki Hayashi, both of Kanagawa, Japan

[73] Assignee: Sumitomo Electric Industries, Ltd., Osaka, Japan

[21] Appl. No.: 122,438

[22] Filed: Nov. 19, 1987

[30] Foreign Application Priority Data

Nov. 20, 1986 [JP] Japan .................................. 61-277111
Nov. 20, 1986 [JP] Japan .................................. 61-277112
Dec. 1, 1986 [JP] Japan .................................. 61-286149

[51] Int. Cl.$^4$ ............................................. H01L 21/44
[52] U.S. Cl. .................................... 437/41; 437/44; 437/912; 437/187; 437/184; 437/176; 437/177; 357/15; 357/22
[58] Field of Search ................ 437/40, 41, 44, 175, 437/176, 177, 184, 187, 912; 357/15, 22 I

[56] References Cited

U.S. PATENT DOCUMENTS

| | | | |
|---|---|---|---|
| 4,569,119 | 2/1986 | Terada et al. | 437/176 |
| 4,599,790 | 7/1986 | Kim et al. | 437/187 |
| 4,636,822 | 1/1987 | Codella et al. | 357/22 |
| 4,711,858 | 12/1987 | Harder et al. | 437/176 |
| 4,731,339 | 3/1988 | Ryan et al. | 437/29 |
| 4,745,082 | 5/1988 | Kwok | 437/39 |

FOREIGN PATENT DOCUMENTS

| | | |
|---|---|---|
| 59-110171 | 6/1984 | Japan . |
| 6273673 | 4/1987 | Japan . |
| 6276566 | 4/1987 | Japan . |

OTHER PUBLICATIONS

Shikata et al., "Formation of Submicron Silcon-Nitride Patterns by Lift-Off Method Using ECR-CVD", SPIE, vol. 797, Advanced Processing of Semiconductor Devices, 1987, pp. 126-129.

Matsuo et al., "Low Temperature Chemical Vapor Deposition Method Utilizing an Electron Cyclotron Resonance Plasma", Jap. J. of Appl. Phys., vol. 22, No. 4, Apr. 1983, pp. L210-L212.

Codella et al., "GaAs LDD E-MESFET For Ultra-High Speed Logic", IBM Technical Disclosure Bulletin, vol. 26, No. 4, Sep. 1983, pp. 1988-1989.

Yamasaki et al., "GaAs LSI-Directed MESFET's with Self-Aligned Implantation for N+-Layer Technology (SAINT)", IEEE Trans. on Electron Devices, vol. ED-29, No. 11, Nov. 1982, pp. 1772-1777.

Ghandhi, VLSI Fabrication Principles, John Wiley and Sons, Inc., 1983, pp. 330-333 and 548-550.

Wolf et al., Silicon Processing for the VLSI Era, vol. 1: Process Technology, Lattice Press, 1986, pp. 335-336 and 357-359.

Primary Examiner—Brian E. Hearn
Assistant Examiner—M. Wilczewski
Attorney, Agent, or Firm—Cushman, Darby & Cushman

[57] ABSTRACT

A method of forming a self-aligned gate electrode of a field effect transistor, in which a resist pattern is formed on a substrate by lithography, an ion-implanted layer in the substrate at the side of the resist is formed by ion implantation, an insulating film is formed on the substrate by electron cyclotron resonance plasma chemical vapor deposition, the resist pattern and a part of the insulating film on the resist pattern removed by lift-off to thereby form an insulating pattern with an opening, the substrate annealed to activate said ion-implanted layer and a gate electrode formed in the opening by a spacer lift-off method.

16 Claims, 4 Drawing Sheets

PRIOR ART

METHOD OF PRODUCING THE GATE ELECTRODE OF A FIELD EFFECT TRANSISTOR

BACKGROUND OF THE INVENTION

The present invention relates to a method of producing a self-aligned gate electrode of a field effect transistor, and more particularly, relates to a method of producing an insulating film pattern for forming a self-aligned gate electrode in the process of producing a field effect transistor.

Conventionally, substitutional and refractory metal techniques are used in forming gates in field effect transistors. The substitional technique is more flexible than the refractory metal approach since the gate material can be selected at will. However, such process has disadvantages as described below.

FIGS. 1(a)–1(i) illustrate a part of the typical conventional process of producing a Schottky-gate field effect transistor.

As shown in FIG. 1(a), a protective insulating film 12 such as a $Si_3N_4$ film is formed on a semiconductor substrate 10, and then a three-layered resist composed of a resist 14, an insulating film 16 such as a $SiO_2$ film, and another resist 18 is formed. The insulating film 16 is then etched while masked with a resist pattern 18A formed by patterning the uppermost resist 18 as shown in FIG. 1(b), to prepare an insulating film pattern 16A. Next, the resist 14 is etched by RIE while masked with the insulating film pattern 16A to thereby form a resist pattern 14A. While masked with the insulating film pattern 16A and the resist pattern 14A, ion implantation is carried out as shown by the arrow 20 of FIG. 1(c) to thereby form a source region 22A and a drain region 22B.

After the implantation of the source and drain regions, an $SiO_2$ film 24 is formed on the surface of the substrate by sputtering or the like is shown in FIG. 1(d). After slight-etching, the resist pattern 14A and insulator 16A are removed by lift-off method to thereby form a reversal pattern 24A of the $SiO_2$ film as shown in FIG. 1(e).

Further, as shown in FIG. 1(f), after ohmic electrodes 26A and 26B are respectively formed on the source region 22A and the drain region 22B, a three-layered resist 28 is formed again over the entire surface of the substrate.

Next, the uppermost layer of the three-layered resist 28 is patterned to have an opening corresponding to a gate electrode. The insulating film formed at the middle layer of the three-layered resist 28 is masked with the resulting resist pattern formed at the uppermost layer. Further, the lowermost layer of the three-layered resist 28 is selectively removed while masked with the resulting insulating film pattern to thereby form a two-layered resist pattern 28 as shown in FIG. 1(g).

While masked with the pattern of the two-layered resist 28, a part of the insulating film 12 is removed by reactive-ion etching to thereby obtain an insulating film 12 with an opening 30 as shown in FIG. 1(h). Further, gate electrode material is deposited while masked with the pattern of the two-layered resist 28, and then the pattern of the two-layered resist 28 is removed by lift-off to thereby form a gate electrode 32 as shown in FIG. 1(i).

In the conventional method, however, the gate region of the crystal surface is often damaged by ion radiation because the insulating film 12 in direct contact with the semiconductor substrate 10 is removed by reactive-ion etching. Further, contamination with impurities in the etching process and in the cleaning process after etching is a problem. A damaged and contaminated surface causes deterioration in the characteristics of the field effect transistor.

Further, although a field effect transistor having a gate electrode self-aligned to source and drain regions can be attained by the conventional producing process, a lot of steps are required.

SUMMARY OF THE INVENTION

It is therefore an object of the present invention to provide, in a process of manufacturing a field effect transistor, a method of forming an insulating film pattern having excellent insulating characteristics without damaging the crystalline substrate.

The objects of the present invention are achieved by using electron cyclotron resonance plasma chemical vapor deposition (haereinafter referred to "ECR plasma CVD") by which an insulating film pattern can be formed without damaging the substrate.

The invention provides a method of forming a self-aligned gate electrode of a field effect transistor, namely, forming a reist pattern by lithography, forming an active layer in the substrate by applying ion implantation to the substrate, forming an insulating film on the substrate by an ECR plasma CVD method, removing the resist pattern and a part of the insulating film thereon by lift-off to thereby form an insulating pattern with an opening, annealing the substrate to activate the ion-implanted layer, and forming a gate electrode in the opening by lift-off.

Although the aforementioned method of forming an insulating pattern according to the present invention can be applied to the process of manufacturing field effect transistors, it is to be understood that the invention is not limited thereto and that the method according to the invention may be applied to manufacturing other semiconductor devices as long as the inulating film pattern is formed of $Si_3N_4$, $SiO_2$, $SiO_xN_y$ or the like. Further, the method according to the invention can be used even where the gate length is of the order of submicrons, and particularly, the method is suitable for manufacturing short-gate-length transistors having excellent characteristics.

According to the present invention, the insulating film pattern can be easily formed by lift-off because of the use of an ECR plasma CVD method. Furthermore, it is unnecessary to use reactive-ion etching. The use of an ECR plasma CVD method has the advantage that the film can be formed at a low temperature so that a resist or the like is not changed in quality. Further, lift-off can be easily performed due to the straight path shower of ions and radicals, compared to other film forming methods, such as a CVD, sputtering method and the like.

Further, the film produced according to the invention is excellent in quality and durability against etching. The invention provides an excellent film which is not peeled off even when annealed at about 800° C., and in which the diffusion of Ga and As can be suppressed.

According to the method of forming an insulating film of the present invention, the substrate as a ground layer prepared for the formation of a gate electrode or the like is not damaged, so that excellent Schottky characteristics can be obtained. Further, there is no contamination with impurities at etching, so that excellent insulating characteristics can be attained.

DETAILED DESCRIPTION OF THE PREFERRED EMBODIMENTS

The preferred embodiments of the present invention will now be described in detail with reference to the accompanying drawings. It should be noted that the present invention is not limited to the embodiments.

The ECR plasma CVD method used in the present invention employs an ECR plasma CVD apparatus as disclosed in Japanese Journal of Applied Physics, Vol. 22, page 210, 1983.

This kind of ECR plasma CVD apparatus includes a plasma chamber and a reaction chamber (sample chamber), the plasma chamber being connected to a microwave waveguide through a separator and surrounded by an electromagnet to form a divergent magnetic field for establishing an ECR condition in the plasma chamber together with a microwave and for drawing out the plasma within the reaction chamber. The plasma chamber is connected to the reaction chamber through a plasma-drawing window so that the plasma is led towards the sample mounted on a sample stage by the divergent magnetic field.

A gas, such as $N_2$, $O_2$, $NH_3$, a mixed gas of those described above, or the like, is introduced into the plasma chamber where the ECR condition is established by the microwave and magnetic field, and then a plasma gas formed in the plasma chamber is led to the reaction chamber by the divergent magnetic field. On the other hand, the reaction chamber includes a substrate mounted on the sample stage. A material gas, such as $SiH_4$, $Si_2H_6$, $Si_3H_8$ or the like, for forming an insulating film is introduced into the reaction chamber. The gas is excited or activated by the aforementioned plasma to thereby cause a reaction, so that a predetermined reaction product is deposited on the substrate.

It is preferable that the insulating film formed by the ECR plasma method is selected from the group comprising $Si_3N_4$, $SiO_2$ and silicon oxynitride films.

FIG. 2 shows a method of forming an insulating film and a gate electrode of a field effect transistor according to a first embodiment of the present invention.

Figure 2A:
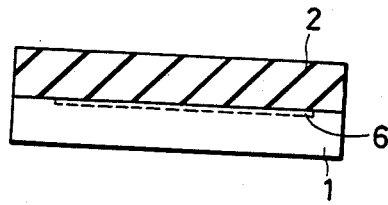
FIGS. 2(a)–2(f) are views showing the steps in a method of producing a field effect transistor according to a first embodiment of the invention.
Figure 2B:
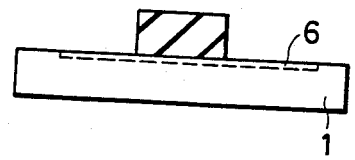
Figure 2C:
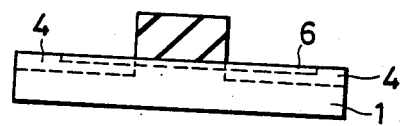

In FIG. 2(a), a resist film 2, such as a photoresist or the like, is applied onto a Group III–V compound semiconductor substrate 1, such as GaAs or the like, with a shallow active layer 6, is formed by low dose ion implantation or epitaxial growth. After forming a resist pattern 2A (FIG. 2(b)), impurities are implanted into the substrate masked by the resist pattern to thereby form a self-aligned ion-implanted $N^+$ layer 4 (FIG. (2c)) representing the source and the drain regions of the MESFET.

Figure 2D:
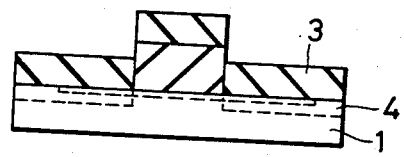
Figure 2E:
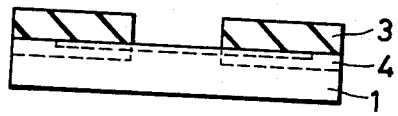

Next, an insulating film 3, such as silicon nitride, silicon oxide, silicon oxynitride or the like, is formed on the substrate by an ECR plasma CVD method (FIG. 2(d)). After slight-etching of the insulating film deposited on the resist pattern 2A, the remaining part of the insulating film on the residual resist pattern is lifted off by an organic solvent to thereby form an insulating film pattern having an opening as shown in FIG. 2(e).

Figure 2F:
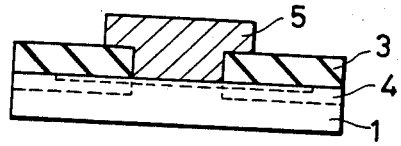

The thus obtained substrate having the insulating film pattern with the desired opening is annealed in $AsH_3$ to activate the ion-implanted layer. After forming ohmic electrodes, a resist pattern having an opening larger than the opening of the insulating film pattern is formed on the insulating film, and an electrode material such as Ti/Pt/Au or the like is applied onto a region containing the opening of the insulating film pattern, so that a gate electrode 5 as shown in FIG. 2(f) can be formed by spacer lift-off.

As an example, an insulating film pattern and a gate electrode for a field effect transistor were formed on a substrate according to the process shown in FIG. 2 as follows.

A GaAs substrate was used as a semiconductor substrate. A photoresist film (AZ-1400) was applied onto the whole surface of the substrate. The photoresist film was exposed to light in a predetermined pattern and then developed to form a resist pattern. With masking the substrate by the resist pattern, ions of $^{28}Si^+$ were implanted in the substrate in an implantation concentration of about $3 \times 10^{13}/cm^2$. Next, an $Si_3N_4$ film of about 3,000 Å thickness was formed by using an ECR plasma CVD apparatus and a mixed gas of $SiH_4$, $NH_3$ and $N_2$. Next, the masking resist pattern was removed by an organic solvent lift-off method whereby dissolving the resist lifts off the insulating film deposited on its surface to form an insulating film pattern 3A. The substrate thus processed was annealed in $AsH_3$ at about 800° C. for 30 minutes. After forming AuGe/Ni ohmic electrodes, Ti/Pt/Au electrode material was applied onto the region of the substrate containing an opening of the insulating film pattern, so that a gate electrode was formed by spacer lift-off method. Prior to metallization, a thin insulator film can be formed in order to cover crystal surface, and in the process of gate formation, this insulator can be removed by wet etching. As the result of measurement, the transconductance (gm) of the transistor was determined to be 230 mS/mm at gate length 1.0 μm.

Incidentally, a lightly doped drain (LDD) structure and a double-implanted LDD structure [DI-LDD] having buried p-type pockets can also be obtained by the aligned method.

For comparison, by the conventional method using reactive-ion etching as shown in FIG. 1, an $Si_3N_4$ insulating film and a gate electrode were formed on a GaAs substrate as follows.

Figure 1A:
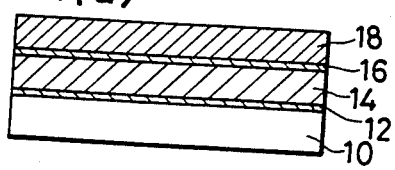
FIGS. 1(a)–1(i) are views showing the steps in a conventional prior art method of producing a field effect transistor.
Figure 1G:
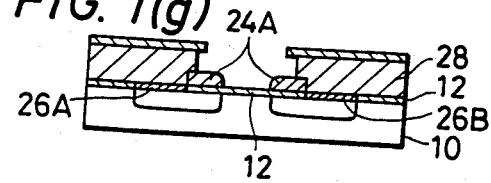
Figure 1B:
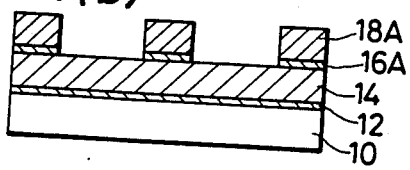
Figure 1H:
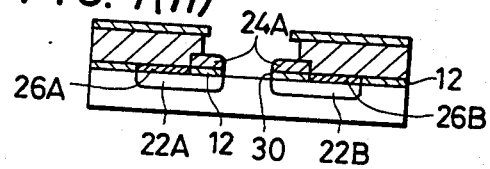
Figure 1C:
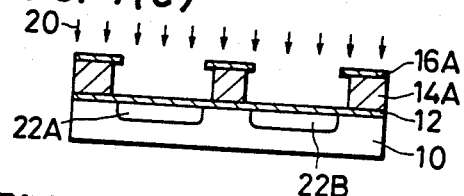
Figure 1I:
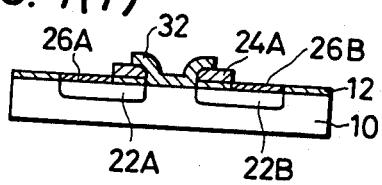
Figure 1D:
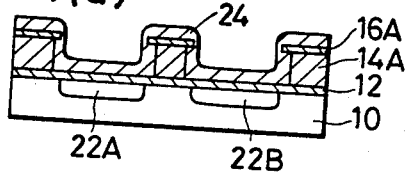
Figure 1E:
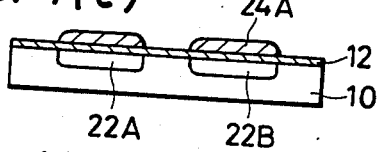
Figure 1F:
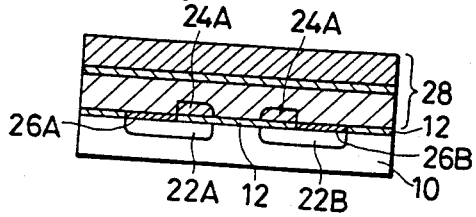

After forming a three-layered resist pattern on a substrate of GaAs as shown in FIG. 1(b), impurities were implanted into the substrate to form a source and drain regions as shown in FIG. 1(c). Next, an $SiO_2$ film was formed on the substrate by a sputtering method (FIG. 1(d)). The resist pattern and the insulating film formed thereon were removed by lift-off to form an insulating film reverse pattern (FIG. 1(e)). After forming Au/Ge/Ni ohmic electrodes, a three-layered resist pattern is further formed (FIG. 1(g)). The insulating film corresponding to the gate region was etched by reactive-ion etching using $CF_4$ gas (FIG. 1(h)). Then, a Ti/Pt/Au gate electrode was provided (FIG. 1(i)). The transconductance (gm) of the thus produced transistor was 170 mS/mm at late length 1.0 μm.

FIG. 3 shows a method of forming a gate electrode on a field effect transistor according to a second embodiment of the present invention. This embodiment is identical to the first embodiment except that a protective film for annealing is formed prior to the annealing process.

Figure 3A:
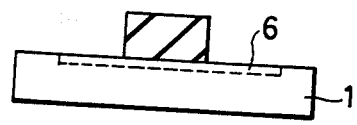
FIGS. 3(a)–3(f) are views showing the steps in a method of producing a field effect transistor according to a second embodiment of the invention.
Figure 3B:
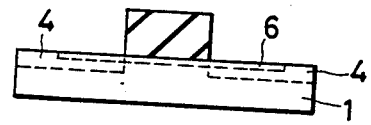

That is, after forming a resist pattern on a substrate with active layer as shown in FIG. 3(a), impurities are implanted into the substrate masked by the resist pattern 2A (FIG. 3(b)) to represent the source and drain regions of the MESFET.

Figure 3C:
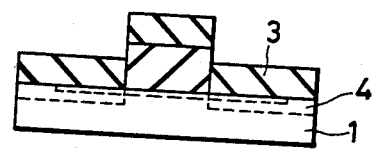
Figure 3D:
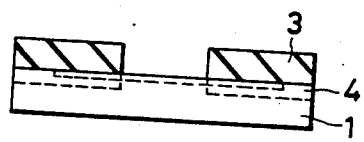

Next, an insulating film 3, such as $Si_3N_4$ or the like, is formed on the substrate by the ECR plasma CVD method (FIG. 3(c)). After slight etching of insulating film deposited on the resist pattern 2A, the remaining part of the insulating film on the residual resist pattern is lifted off by an organic solvent to thereby obtain an insulating film pattern having an opening as shown in FIG. 3(d).

Figure 3E:
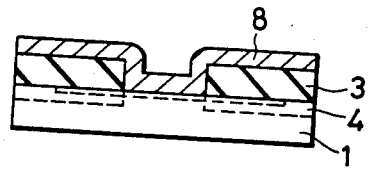

Further, as shown in FIG. 3(e), an annealing protective film 8 is formed on the whole surface of the substrate by sputtering, the plasma CVD method, the atmospheric or reduced-pressure CVD method, or the like, and then the substrate is annealed, for example, in an $N_2$ gas to activate the ion-implanted layer 4.

Figure 3F:
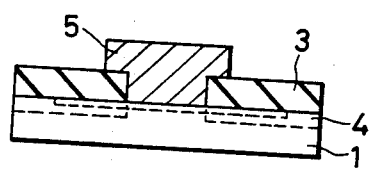

After forming ohmic electrodes, an electrode material, such as Ti/Pt/Au or the like, is applied onto a region containing the opening of insulating film pattern 3A in the same manner as in the first embodiment, so that a gate electrode 5 as shown in FIG. 3(f) can be formed by the spacer lift-off method. Protective film 8 is removed by a wet etching to obtain the insulating film pattern 3A. Inslator such as $Si_3N_4$ grown by ECR-CVD has high resistivity to wet etching, so there is enough wet etching selectivity between films 3 and 8.

As an example, a gate electrode of a field effect transistor was formed on a substrate according to the method shown in FIG. 3 as follows.

A GaAs substrate was used as a semiconductor substrate. With masking the substrate by the resist pattern, ions of $^{28}Si^+$ were implanted into the substrate with the implantation dose of about $3 \times 10^{13}/cm^2$. Next, an $Si_3N_4$ film was formed to an about 2,500 Å thickness, by using an ECR plasma CVD apparatus and a mixed gas of $SiH_4$, $NH_3$ and $N_2$. Next, the masking resist pattern was removed by an organic solvent to lift off the part of the insulating film deposited on the resist pattern 2A to thereby form an insulating film pattern 3A. Next, a 500 Å thick $Si_3N_4$ film as an annealing protective film was formed on a whole surface of the substrate by the plasma CVD method, and then the substrate was annealed in an $A_sH_3$ gas by an electric furnace. After forming AuGe/Ni ohmic electrodes, a Ti/Pt/Au gate electrode was formed by spacer lift-off method, after etching 500 Å $Si_3N_4$ film by buffered hydrofluoric acid. As the result of measurement, the transconductance (gm) of the transistor was found to be 230 mS/MM at gate length 1.0 μm.

FIG. 4 shows a part of the steps in the method of producing a field effect transistor according to a third embodiment of the invention.

Figure 4A:
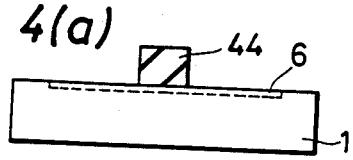
FIGS. 4(a)–4(h) are views showing the steps in a method of producing a field effect transistor according to a third embodiment of the invention.

FIG. 4(a) shows a shallow active layer 6 formed in the substrate 1 by low dose ion implantation or epitaxial growth, and a resist pattern 44 corresponding to a gate electrode in the future formed on the active layer 6.

Figure 4B:
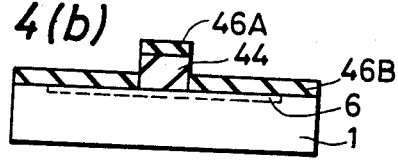

As shown in FIG. 4(b), a first insulating film separated into two parts 46A and 46B is formed on the surface of the resulting substrate 1 by the ECR plasma CVD method. Only a small amount of insulating film is formed on the side of the resist pattern 44.

Figure 4C:
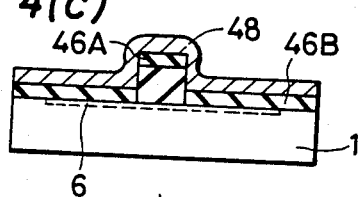

As shown in FIG. 4(c), a second insulating film 48 is formed on the first insulating film by sputtering or the like.

Figure 4D:
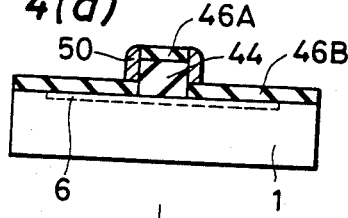

Next, a part of the second insulating film 48 is removed from the substrate and the horizontal portion of the resist pattern by a directional etching method such as reactive ion etching (RIE) to thereby leave a second insulating film pattern 50 only at the sides of the resist pattern 44 as shown in FIG. 4(d).

Figure 4E:
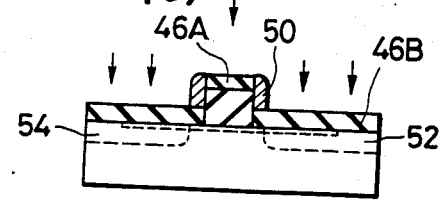

Under the aforementioned state, impurity ions are implanted in the substrate to thereby form an $n^+$ source region 52 and an $n^+$ drain region 54 as shown in FIG. 4(e).

Figure 4F:
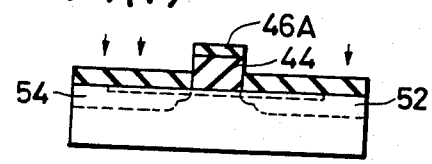

Next, the second insulating film 50 is removed from the sides of the resist pattern 44 by wet etching as shown in FIG. 4(f). There are enough etching selectivity between 46B and 50. Then, impurity ions are implanted at a moderate dosage and energy level in the substrate again.

Figure 4G:
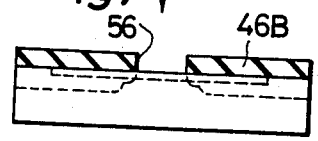

Further, the resist pattern 44 and the first insulating film pattern 46A on the resist pattern 44 are removed by a lift-off method so as to form an ECR plasma CVD first insulating film pattern 46B having an opening 56 as shown in FIG. 4(g).

Figure 4H:
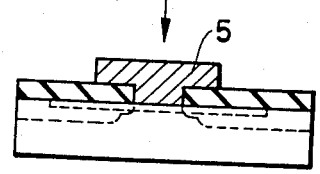

After forming ohmic electrodes, as shown in FIG. 4(h), a gate electrode 5 is formed on the substrate within the opening 56.

As an example, an insulating film pattern and a gate electrode for a field effect transistor were formed on a substrate according to the method shown in FIG. 4 as follows.

A GaAs substrate 1 was used as a semiconductor substrate. The resist pattern that is a dummy gate was formed by lithography.

Next, as shown in FIG. 4(b), an $Si_3N_4$ film 46 with a thickness of about 2,000 Å was formed from a mixed gas of $SiH_4$, $NH_3$ and $N_2$ by an ECR plasma CVD method.

Next, as shown in FIG. 4(c), an $SiO_2$ film 48 with a thickness of about 2,000 Å was made by bias sputtering method so that the sides of the resist pattern 44 were also effectively coated.

Next, a part of the $SiO_2$ film 48 was removed by RIE from the substrate and the horizontal portion to thereby leave an $SiO_2$ film pattern 50 at the sides of the resist pattern 44 as shown in FIG. 4(d).

Under the aforementioned condition, $^{28}Si^+$ ions were implanted into the substrate at an acceleration voltage of 150 to 200 KV to thereby form an $n^+$ source region 52 and an $n^+$ drain region 54 with the implantation dose of $3 \times 10^{13}/cm^2$ as shown in FIG. 4(e).

Next, as shown in FIG. 4(f), the $SiO_2$ film 50 was removed from the side of the resist pattern 44 by etching using a hydrofluoride buffer solution diluted with $NH_4F$. Then, $^{28}Si^+$ ions were implanted at a moderate dosage and energy level into the substrate. Further, the structure comprising a first portion 46A of the $Si_3N_4$ film and the resist pattern 44 was removed by lift-off using acetone to thereby form an ECR plasma CVD $Si_3N_4$ film pattern 46B having an opening 56 as shown in FIG. 4(g).

Next, the thus prepared substrate was annealed in an $AsH_3$ atmosphere at about 800° C. for 30 minutes. The annealing must be carried out in such an $AsH_3$ atmosphere to prevent As evaporation from the GaAs substrate.

After forming AuGe/Ni ohmic electrodes, a gate electrode of Ti/Pt/Au was formed by spacer lift-off as shown in FIG. 4(h). As the result of measurement, the trans conductance (gm) was found to be 230 mS/mm at gate length 1.0 μ.

In the aforementioned method of producing a field effect transistor according to the third embodiment of the present invention, the first insulating film is formed by an ECR plasma CVD method and then the second insulating film is formed thereon. The insulating film formed by the ECR plasma CVD method and the insulating film formed by a conventional method such as a sputtering method or the like, are different from each other in deposition conditions, etching characteristics and the like.

The use of the ECR plasma CVD method makes it possible to form a film at a low temperature, so that a resist or the like does not deteriorate. If a conventional method such as a plasma CVD or the like is used to form an insulating film, the resist just under the insulating film deteriorates and becomes difficult to dissolve in solvent. Further, only a small amount of the insulating film is formed on the sides of the resist pattern due to the use of ECR plasma CVD, and accordingly, in the ECR plasma CVD method, lift-off can be easily performed compared to other film forming methods, such as a CVD, sputtering method and the like.

Further, by changing etching conditions, it is possible to remove only the insulating film formed by the ECR plasma CVD method or to remove only the insulating film formed by the conventional method such as sputtering or the like. Accordingly, any one of the aforementioned first and second insulating films can be selectively removed, whether the films were annealed or not.

Further, the film formed by the ECR plasma CVD method is excellent in quality and durability against etching. In short, the ECR plasma CVD method provides an excellent film which is not peeled off even when annealed at about 800° C., and which can suppress the diffusion of components, such as Ga, As and the like, of a compound semiconductor.

Accordingly, when an etching method is suitably selected after the second insulating film is formed on the first insulating film, the second insulating film can be partly removed while leaving a part of the second insulating film at the sides of the resist pattern.

Under this state, source and drain regions can be formed by implanting ions into the semiconductor substrate.

When the resist pattern and the first insulating film on the resist pattern are removed by lift-off, a first insulating film pattern having an opening corresponding to the resist pattern can be formed. When a gate electrode is formed in the opening, the gate electrode is automatically aligned to the implanted regions. That is, a self-aligned gate electrode can be formed.

Further, when the source and drain regions are formed by ion implantation in the state in which the second insulating film is left at the side of the resist pattern, an LDD (lightly doped drain) MESFET structure can be formed.

In this embodiment of the invention, the second insulating film is formed by bias sputtering, and the removal of the second insulating film is by reactive-ion etching. In spite of using reactive-ion etching for removing the second insulating film, the substrate is not at all damaged because the substrate is protected by the first insulating film.

Also, it is preferable that the first insulating film is a silicon nitride film and the second insulating film is selected from the group comprising silicon nitride, silicon oxide and silicon oxynitride films. The semiconductor substrate may be made of a Group III–Group V compound semiconductor such as GaAs, InP etc.

Further, the method of producing a field effect transistor according to the third embodiment of the invention can be used even in the case where the gate length is of the order of submicrons, so the method is suitable for manufacturing short-gate-length transistors having excellent characteristics. In the case where the gate length is of the order of submicrons, the short-channel effect can be effectively suppressed if buried p layer is implanted under the lightly-doped drain regions to form a DI-LDD-MESFET structure according to the method of the invention.

As described above, according to the present invention, not only the surface of the substrate on which a gate electrode will be formed is not damaged, but also the gate electrode is self-aligned to the source and drain regions. Accordingly, a field effect transistor having excellent electrical characteristics can be produced.

Further, according to the present invention, a field effect transistor having a gate electrode selfaligned to source and drain regions can be produced by a small number of steps compared to those of the conventional method.

Also, according to the present invention, an LDD structure having a self-aligned gate electrode can be obtained. By using such an LDD structure, the operation speed can be increased without causing the short-channel effect even if the gate length is scaled down to the submicron level.

What is claimed is:

1. A method of forming a self-aligned gate electrode of a field effect transistor, consisting essentially of the steps of:
   forming a resist pattern on a first portion of a semiconductor substrate by a lithography process;
   forming an ion-implanted layer in a second portion of said substrate not covered with said resist pattern, by ion implantation into said substrate;
   forming an insulating film on said substrate and said resist pattern by electron cyclotron resonance plasma chemical vapor deposition;
   removing said resist pattern and a part of said insulating film on said resist pattern by lifting off to thereby leave an insulating pattern with an opening at said second portion;
   annealing said substrate to activate said ion-implanted layer; and
   forming a gate electrode on said opening by a spacer lift-off process.

2. A method of forming a self-aligned gate electrode according to claim 1, in which said insulating film is selected from the group consisting of a slicon nitride film, a silicon oxide film and a silicon nitride oxide film.

3. A method of forming a self-aligned gate electrode according to claim 1, in which said semiconductor substrate is made of a group III–V compound semiconductor.

4. A method of forming a self-aligned gate electrode according to claim 3, in which said Group III–V compound semiconductor is GaAs.

5. A method of forming a self-aligned gate electrode according to claim 1, further comprising the steps of forming an annealing protective film on the whole surface of said substrate before said annealing step, and removing said protective film by using an organic solvent after said annealing step.

6. A method of forming a self-aligned gate electrode according to claim 5, in which said insulating film is selected from the group consisting of a silicon nitride film, a silicon oxide film and a silicon nitride oxide film.

7. A method of forming a self-aligned gate electrode according to claim 5, in which said annealing protective film is formed by electron cyclotron resonance plasma chemical vapor deposition.

8. A method of forming a self-aligned gate electrode according to claim 5, in which said semiconductor substrate is made of a Group III-V compound semiconductor.

9. A method of forming a self-aligned gate electrode according to claim 8, in which said Group III-V compound semiconductor is GaAs.

10. A method of producing a self-aligned gate electrode of a field effect transistor, comprising the steps of:
   forming a resist pattern on a semiconductor substrate at a first location, corresponding to a gate region;
   forming a first insulating film on said substrate and on said resist pattern by electron cyclotron resonance plasma chemical vapor deposition;
   forming a second insulating film on said first insulating film, and on exposed edges of said resist pattern;
   removing said second insulating film except for said part of said second insulating film on said exposed edges of said resist patter;
   forming a source region and a drain region for said field effect transistor by ion implantation into said substrate with said resist pattern and said first and second insulating films in place;
   then removing said part of said second insulating film;
   then applying a moderate dosage and energy level ion implantation to said substrate;
   removing said resist pattern and said insulating film on said resist pattern by lifting-off to thereby form a pattern on said first insulating film having an opening; and
   forming a self-aligned gate electrode on said opening by spacer lift-off.

11. A method of producing a self-aligned gate electrode according to claim 10, in which said second insulating filmis removed by reactive-ion etching.

12. A method of producing a self-aligned gate electrode according to claim 10, further comprising the step of annealing said substrate after the formation of said pattern of said first insulating film to activate the ion-implanted layer, in which said gate electrode is refractory.

13. A method of producing a self-aligned gate electrode according to claim 10, in which said first insulating film is a silicon nitride film.

14. A method of producing a self-aligned gate electrode according to claim 10, in which said second insulating film is selected from the group consisting of a silicon nitride film, a silicon oxide film and a silicon nitride oxide film.

15. A method of producing a self-aligned gate electrode according to claim 10, in which said semiconductor substrate is made of a Group III-V compound semiconductor.

16. A method of producing a self-aligned gate electrode according to claim 15, in which said Group III-V compound semiconductor is GaAs.

* * * * *